(12) United States Patent
Watanabe et al.

(10) Patent No.: US 7,538,568 B2
(45) Date of Patent: May 26, 2009

(54) SPRING LOADED PROBE PIN

(75) Inventors: Kitaru Watanabe, San Jose, CA (US);
Hiroyuki Nagahata, Ozu-machi (JP);
Nobuki Kumazawa, San Jose, CA (US);
Kei Kimura, Ozu-machi (JP)

(73) Assignee: Sanyu Switch Co., Ltd, Nishi-Gotanda, Shinagawa-Ku, Tokyo (JP)

( * ) Notice: Subject to any disclaimer, the term of this patent is extended or adjusted under 35 U.S.C. 154(b) by 0 days.

(21) Appl. No.: 11/824,998

(22) Filed: Jul. 2, 2007

(65) Prior Publication Data
US 2008/0252326 A1  Oct. 16, 2008

(30) Foreign Application Priority Data
Apr. 10, 2007 (JP) .................. 2007-103102

(51) Int. Cl.
*G01R 31/02* (2006.01)
(52) U.S. Cl. ...................................... 324/761
(58) Field of Classification Search ............ 324/761
See application file for complete search history.

(56) References Cited

U.S. PATENT DOCUMENTS

| | | | |
|---|---|---|---|
| 4,658,212 A * | 4/1987 | Ozawa et al. | 324/754 |
| 4,918,384 A * | 4/1990 | Giringer et al. | 324/761 |
| 4,925,695 A * | 5/1990 | Martin et al. | 426/660 |
| 4,931,726 A | 6/1990 | Kasukabe et al. | |
| 5,003,255 A | 3/1991 | Kazama | |
| 6,208,155 B1 * | 3/2001 | Barabi et al. | 324/754 |
| 6,222,377 B1 * | 4/2001 | Kato | 324/754 |
| 6,323,667 B1 | 11/2001 | Kazama | |
| 6,512,389 B1 * | 1/2003 | Kocher | 324/755 |
| 6,652,326 B2 * | 11/2003 | Boyle et al. | 439/700 |
| 2007/0296436 A1 * | 12/2007 | Winter | 324/761 |

FOREIGN PATENT DOCUMENTS

| | | |
|---|---|---|
| JP | 2000-243500 | 9/2000 |
| JP | 3326095 | 7/2002 |
| JP | 2006-090941 | 4/2006 |
| JP | 2006-164660 | 6/2006 |
| WO | WO98/29751 | 7/1998 |

* cited by examiner

*Primary Examiner*—Ha Tran T Nguyen
*Assistant Examiner*—Richard Isla Rodas
(74) *Attorney, Agent, or Firm*—Donn K. Harms

(57) ABSTRACT

A conductive plunger 3 is received inside a cylindrical conductive barrel 2 so as to be capable of moving backward and forward, an urging coil spring 4 for pushing a rear end 3b of the plunger 3 is received inside the barrel 2, and a front end 3a of the plunger 3 is protruded from an opening at one end 2a of the barrel 2. In this probe 1, stable electrical contact is achieved by inserting a conductive coil spring 5 that does not urge the plunger 3 between the inner circumference of the barrel 2 and the outer circumference of the plunger 3 to realize electrical contact between the inner circumference of the barrel 2 and the outer circumference of the plunger 3 via this coil spring 5.

10 Claims, 8 Drawing Sheets

SPRING LOADED PROBE PIN

BACKGROUND OF THE INVENTION

1. Field of the Invention

The present invention relates to probes used in the electrically testing and so forth of various types of electrical and electronic components. More specifically, the present invention relates to a probe in which a rear end of a plunger, which is inserted in a cylindrical barrel so as to be capable of moving backward and forward therein, is urged by a coil spring so that a front end thereof is made to protrude from an open end of the barrel.

2. Description of the Related Art

As shown in FIG. 5, a probe 1 used in electrically testing and so forth of various types of electrical and electronic components has a configuration in which a conductive plunger 3 is inserted inside a conductive barrel 2, formed in the shape of a cylinder, so as to be capable of moving backward and forward inside the barrel 2. One end of the plunger 3 protrudes from the end of the barrel 2 so as to establish contact with terminals or the like of an object to be tested, using the end of the plunger.

In order to prevent the plunger 3 from being pulled out from the barrel 2, for example, a portion of the plunger 3 that is inserted inside the barrel 2 is formed wider than the other portions, and in addition, a diameter of an open end portion of the barrel 2 is made narrower to prevent the plunger 3 from passing through.

In order to enable the plunger 3 to make resilient contact with the terminals or the like of the object to be tested, a coil spring 4 is received inside the barrel 2 to push a rear end 3b of the plunger 3. The plunger 3 is thus urged in a direction such that a front end 3a of the plunger 3 protrudes from the barrel 2.

For electrical contact between the object to be tested and the test equipment via the probe 1, the probe 1 having the above-described structure is configured so that, first, the front end 3a of the plunger 3 makes contact with the terminals or the like of the object to be tested, and the plunger 3 makes contact with an inner wall 21 of the barrel 2, inside the barrel 2. By doing so, electrical contact is established with the test equipment via a wiring cable or the like that is connected to the barrel 2.

However, the plunger 3 is formed to have a diameter slightly smaller than the inner diameter of the barrel 2 so as to allow it to easily move backward and forward inside the barrel 2; it is thus received inside the barrel 2 with some amount of play. Accordingly, when the plunger 3 has itself swung inside the barrel 2 due to this play, the contact conditions between the outer circumference of the plunger 3 and the inner wall 21 of the barrel 2 change.

As a result, the change in the contact conditions between the inner wall of the barrel 2 and the plunger 3 causes variations in the electrical contact conditions and causes the contact conditions to deteriorate, thus affecting the electrical contact conditions, for example, the high-frequency characteristics.

In order to prevent changes in the electrical contact conditions due to the unstable contact between the plunger 3 and the barrel 2, a probe has been proposed in which the outer circumference of the plunger 3 is pressed against the inner circumference of the barrel 2 by cutting the rear end 3b of the plunger 3 on a slant, as shown in FIG. 6, and pushing the spring 4 against this inclined surface (see JP2000243500A2).

In a similar configuration in which the rear end 3b of the plunger 3 is cut at an angle, as shown in FIG. 7, a probe 1 has been proposed in which a conductive bias pin 7 is introduced between the plunger 3 and the spring 4. Not only the outer circumferential surface of the plunger 3 is pressed against the inner wall of the barrel 2, but the bias pin 7 is also brought into contact with the inner wall of the barrel 2, which improves the electrical contact conditions by increasing the contact area via the bias pin 7 (see JP200690941A2). Furthermore, as shown in FIGS. 8A and 8B, a probe 1 has been proposed in which, in order to improve the contact between the inner circumference of the barrel 2 and the outer circumference of the plunger 3, protrusions 29 and 39 are formed in the inner wall of the barrel 2 and/or in the outer circumference of the plunger 3, respectively, which increases the contact area between the two (see FIGS. 6 and 7 in JP2006164660A2).

In the probes 1 in the related art, having the configuration described above, in the probe having the configuration in which the rear end 3b of the plunger 3 is cut at an angle (FIGS. 6 and 7), an axial-direction force exerted by the coil spring 4 acts, via the inclined surface, as a force that moves the plunger 3 in a direction intersecting the axis; therefore, it is possible to press the outer face of the plunger 3 against the inner wall 21 of the barrel 2 while the axial direction of the plunger 3 and the axial direction of the barrel 2 remain parallel. As a result, as shown by the x marks in FIG. 6, it is possible to establish contact between the outer circumference of the plunger 3 and the inner circumference of the barrel 2 over a relatively long distance in the longitudinal direction of the plunger 3.

However, the force acting on the plunger 3 is not only the urging force from the spring 4, but also a pressing force exerted when the front end 3a of the plunger 3 presses against the object to be tested.

Thus, when the pressing force of the object to be tested, which is exerted on the plunger 3, includes not only a component in the axial direction of the plunger 3, but also a component in a direction intersecting the axial direction, the plunger 3 swings even in the probe 1 having the above-described configuration, in which the rear end 3b of the plunger 3 is cut at an angle.

When swing of the plunger 3 occurs in this way, and the axial direction of the plunger 3 is disposed at an angle with respect to the axial direction of the barrel, as shown in FIG. 9, the outer circumference of the plunger 3 contacts the inner wall 21 of the barrel 2 at only a few points. Therefore, there is the problem described above, namely, that the contact area is drastically reduced compared to the case described with reference to FIG. 6, and the electrical resistance increases.

Moreover, in the configuration in which the bias pin 7 is provided between the coil spring 4 and the rear end 3b of the plunger 3, as shown in FIG. 7, when using such a probe 1 to test semiconductor devices or the like, it is necessary to form the bias pin 7 with a total length of about 1 mm to 2 mm. Because this bias pin 7 with such a minute size must be machined to have a complex shape, as shown in FIG. 7, high-level technology is required to machine the bias pin 7.

The increased number of parts resulting from providing the bias pin 7, combined with the fact that the parts are extremely small, makes the assembly of the probe 1 more difficult. As a result, the production efficiency of this type of probe 1 is reduced.

In addition, the difficulty of production and assembly increases the manufacturing costs of the probe, and the cost increase is thus reflected in the price, causing the price competitiveness to be reduced.

In the related art described in JP2006164660A2, when contact is established between the inner wall 21 of the barrel 2 and the outer circumference of the plunger 3 without providing protrusions, contact is established at only one point when viewed in cross section from the orthogonal direction with respect to the axis. In contrast, by providing the protrusions described above, contact occurs at multiple points. Due to the increase in contact area as a result of increasing the number of contact points in this way, it is possible to improve the electrical characteristics; for example, the electrical resistance is reduced.

However, by forming the protrusions on the outer circumference of the plunger 3 and/or on the inner circumference of the barrel 2 in this way, even though the contact area between the outer circumference of the plunger 3 and the inner circumference of the barrel 2 is increased, if the plunger 3 swings as described above, the contact area between the outer circumference of the plunger 3 and the inner circumference of the barrel 2 is drastically reduced. Therefore, an increase in the electrical resistance is unavoidable, which causes degradation of the measurement results.

Moreover, when using this probe 1 for testing semiconductor devices or the like, it is necessary to form the barrel 2 and the plunger 3, which constitute the probe 1, as comparatively minute parts. In addition, because it is necessary to form protrusions such a minute barrel and plunger, as shown in FIG. 8B, extremely high-level technology is required for their manufacture, which decreases the productivity and increases the manufacturing costs.

The present invention has been conceived in order to overcome the above-described problems with the related art. It is an object of the present invention to provide a probe which can be easily manufactured and which can effectively improve electrical contact between a plunger and a barrel with a relatively simple improvement, namely, by the addition of comparatively simple parts that can be procured at low cost, resulting in a probe with superior electrical characteristics, for example, high-frequency characteristics.

SUMMARY OF THE INVENTION

In order to realize the object described above, in a probe 1 of the present invention, a conductive plunger 3 is received inside a cylindrical conductive barrel 2 so as to be capable of moving backward and forward, an urging coil spring 4 for pushing a rear end 3b of the plunger 3 is received inside the barrel 2, and a front end 3a of the plunger 3 is protruded from an opening at one end 2a of the barrel 2, the probe 1 being characterized in that a conductive coil spring that does not urge the plunger 3 is inserted between an inner circumference of the barrel 2 and an outer circumference of the plunger 3 to serve as a contact-stabilizing coil spring 5 for stabilizing a state of an electrical contact between said barrel and said plunger without urging said plunger.

In the probe 1 with the configuration described above, the contact-stabilizing coil spring 5 may be configured so as to be secured to an inner wall of the barrel 2, and the contact-stabilizing coil spring 5 may be provided in the vicinity of the opening at one end 2a of the barrel 2.

With the above-described probe 1 according to the present invention, apart from the coil spring for urging the rear end 3b of the plunger 3 (the urging coil spring 4), by inserting the conductive coil spring (the contact-stabilizing coil spring 5) between the inner wall 21 of the barrel 2 and the outer circumference of the plunger 3, it is possible to achieve contact between the outer circumference of the plunger 3 and the inner wall 21 of the barrel 2, via the contact-stabilizing coil spring 5, at an insertion position of the coil spring 5.

As a result, it is possible to establish contact between the outer circumference of the plunger 3 and the inner circumference of the barrel 2 at a plurality of points via this contact-stabilizing coil spring 5, even if the plunger 3 has been swung inside the barrel 2. In addition, it is possible to provide a probe 1 in which there is little change in contact area between the inner wall 21 of the barrel 2 and the outer circumference of the plunger 3 due to swing of the plunger 3, thus reducing the change in the electrical contact conditions.

Furthermore, the contact-stabilizing coil spring 5 inserted between the inner circumference of the barrel 2 and the outer circumference of the plunger 3 can also be used as a spring conventionally used for urging a plunger in this type of probe. Therefore, the manufacturing and machining can be achieved more easily and at lower cost, which also minimizes the parts cost that is passed on.

BRIEF DESCRIPTION OF THE DRAWINGS

The objects and advantages of the invention will become understood from the following detailed description of preferred embodiments thereof in connection with the accompanying drawings in which like numerals designate like elements, and in which:

FIG. 4A and FIG. 4B show contact states between the plunger and a barrel, by means of a contact-stabilizing coil spring, wherein FIG. 4A shows a state where the plunger is not swung and FIG. 4B shows a state in which the plunger is swung;

FIGS. 8A and 8B are sectional views of the principal part of a probe in the related art JP2006164660A2), wherein FIG. 8A is a section in the axial direction and FIG. 8B is a section along a line B-B in FIG. 8A.

DETAILED DESCRIPTION OF THE PREFERRED EMBODIMENTS

Next, embodiments of the present invention will be described below with reference to the appended drawings.

General Configuration

Figure 1:
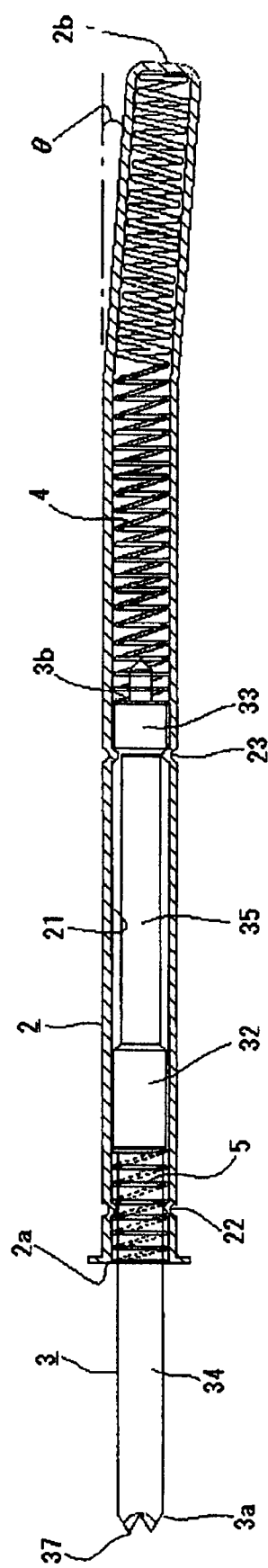
FIG. 1 is a sectional view of the principal part of a probe according to the present invention (showing a state where a plunger is not pushed in)

As shown in FIG. 1, a probe 1 according to the present invention includes a cylindrical barrel 2; a plunger 3 which is inserted in the barrel 2 so that a front end 3a thereof protrudes from an opening at one end 2a of the barrel 2; an urging spring 4, inserted inside the barrel 2 at the side of a rear end 3b of the plunger 3, for pushing the rear end 3b of the plunger 3 to urge the plunger 3 in the direction in which it protrudes from the barrel 2; and a contact-stabilizing coil spring 5 which is inserted between an inner wall 21 of the barrel 2 and an outer circumferential face of the plunger 3, at the side of an open end of the barrel 2. With this configuration, when a terminal or the like of an electrical or electronic component etc. serving as an object to be tested is brought into contact with and pressed against the end of the plunger, the plunger 3 retracts inside the barrel 2 against the urging force of the urging spring 4; by doing so, it is possible to ensure electrical contact with the terminal or the like without causing deformation of or damage to the terminal of the object to be tested.

Plunger

The plunger 3, which in this embodiment is a cylindrical body formed of a conductive material, is configured to establish electrical contact with the barrel 2 by contacting the inner wall 21 of the barrel 2.

Figure 2:
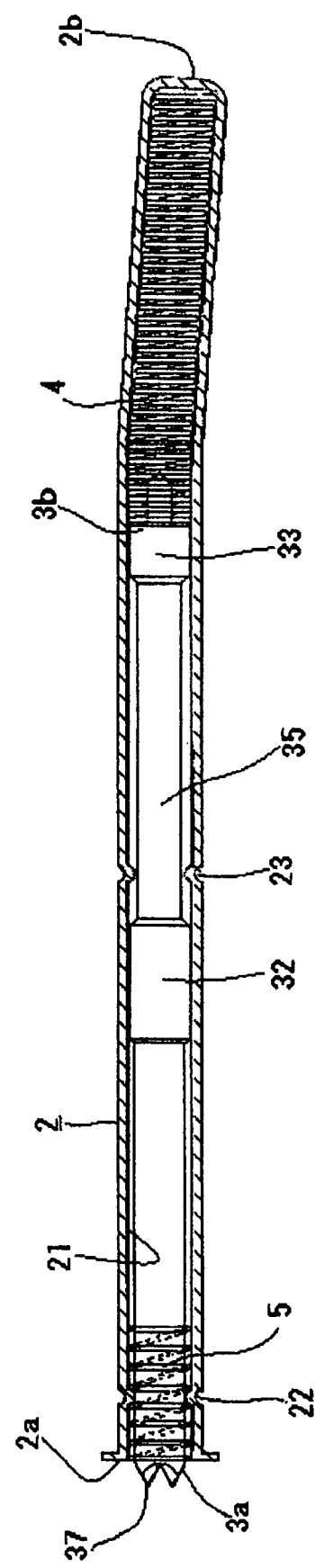
FIG. 2 is a sectional view showing the principal part of the probe according to the present invention (showing a state in which the plunger is pushed in, i.e., an operative state)
Figure 3:
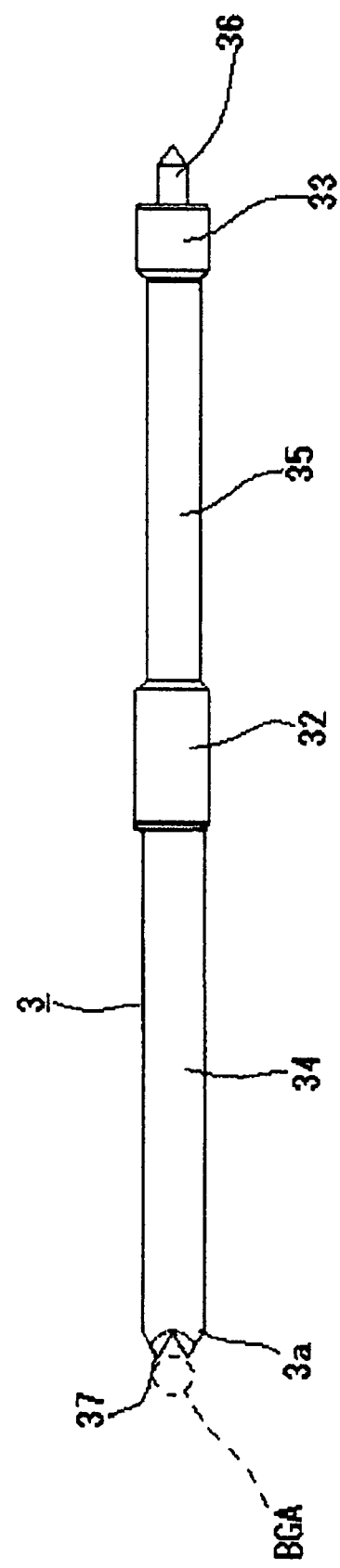
FIG. 3 is a side view of the plunger.

As shown in FIGS. 1 to 3, the plunger 3 includes portions 32 and 33 formed to have a slightly smaller diameter than the inner diameter of the barrel 2 (hereinafter referred to as "large diameter portions") and portions 34 and 35 formed to have a small diameter compared to these large diameter portions 32 and 33 (hereinafter referred to as "small diameter portions"). In this embodiment, the central large-diameter portion 32 is formed in a substantially central position in the longitudinal direction of the plunger 3, and the rear end large-diameter portion 33 is formed towards the rear end 3b of the plunger 3. The other portions serve as the small-diameter portions 34 and 35 formed to have a smaller diameter than these large-diameter portions 32 and 33.

Thus, by providing the plunger 3 with a configuration in which the large-diameter portions 32 and 33 are formed to have a slightly smaller diameter than the inner diameter of the barrel 2, it is easy to achieve contact with the inner wall 21 of the barrel 2 via these large-diameter portions 32 and 33. In addition, these large-diameter portions 32 and 33 are engaged at protrusions 22 and 23 (described later) that protrude at the inner wall 21 of the barrel 2, which prevents the plunger 3 from passing through the barrel 2.

In FIGS. 1 and 2, it is possible to form a projection 36 coaxially with the plunger 3 at the rear end 3b of the plunger 3. Inserting this projection 36 inside an end of the urging coil spring 4, which is described later, prevents the pressing position of the urging coil spring 4 from being shifted with respect to the rear end 3b of the plunger 3.

In the illustrated embodiment, V-shaped grooves are formed at the front end 3a of the cylindrical plunger 3 so as to intersect in the shape of like a cruciform formed by protruding, for example, equiangular four (4) points at the front end, where protruding portions 37 are formed. In case the terminals of the object to be tested are a ball grid array (BGA), and the shape of the groove provides a configuration by which an individual solder bumps constituting the BGA is stably supported between these protruding portions 37 (see FIG. 3). However, the front end of the plunger 3 may take any shape according to the shape of leads provided on the electrical or electronic part under test.

Barrel

The barrel 2 containing the plunger 3 described above is made of a conductive material and is formed in the shape of a cylinder so that it can receive the plunger 3, the urging coil spring 4, which is contained inside the barrel 2 together with the plunger 3, and the contact-stabilizing coil spring 5.

In this embodiment, the cylindrical barrel 2 consists of one open end 2a and the other closed end 2b, and the front end 3a of the plunger 3 is protruded from the side of open one end 2a, and the urging coil spring 4 for urging the plunger 3 is received in the space inside the barrel 2 at the side of the closed other end 2b.

It is also possible to be embodied in which a cylindrical member with both ends opened is used as the barrel, two plungers are protruded from the two ends of the barrel, respectively, and a plunger-urging spring is received in the space between the two plungers.

In the illustrated embodiment, in order to prevent the probe from passing through and to ensure stable contact, a portion of the barrel 2 towards the side of the closed end 2b is bent by an angle of θ in a certain extent of length to form a small curved shape as a whole shown in FIG. 2.

In the barrel 2, the protrusion 22 is protruded towards the center from the inner wall 21 at a position towards the side of the open end (one end 2a) of the barrel 2 for engaging the contact-stabilizing coil spring 5, described later inside the barrel 2. In addition, a protrusion 23 is also formed to be protruded towards the center from the inner wall 21 at the inner wall in the vicinity of the center in the longitudinal direction of the barrel 2 and the protrusion 23 by which engaging the large-diameter portion 33 formed at the side of the rear end 3b of the plunger 3 to restrict the movement in the forward direction.

In this embodiment, the protrusions 22 and 23 are continuously formed in the circumferential direction of the inner wall 21 of the barrel 2 by making a diameter of the barrel 2 smaller partially at positions where the protrusions 22, 23 are formed. However, the protrusions 22 and 23 are not limited to those in the illustrated embodiment; they may be configured in any way so long as they secure the contact-stabilizing coil spring 5 (in the case of the protrusion 22), which is described later, and restrict the range of movement of the plunger 3 (in the case of the protrusion 23).

Coil Springs

As well as the plunger 3, the two coil springs 4 and 5 are received inside the barrel 2. The rear end 3b of the plunger 3 is pressed by one of them (the urging coil spring 4) to urge the plunger 3 in a direction such that the front end 3a of the plunger 3 protrudes from the opening at the one end 2a of the barrel 2. In addition, it is possible to establish good electrical contact between the plunger 3 and the barrel 2 with the other coil spring (the contact-stabilizing coil spring 5).

An Urging Coil Spring

In the illustrated embodiment, the urging coil spring 4 among the coil springs is disposed between the closed end 2b of the barrel 2 and the rear end 3b of the plunger 3 at the side of the closed end 2b and makes it being urged to press the rear end 3b of the plunger 3 with the restoring force thereof.

In the configuration of this embodiment, in which the projection 36 is provided at the rear end 3b of the plunger 3, the projection 36 is inserted inside the coil spring 4, at the side of the one end thereof, to define the contact position of the coil spring 4 with respect to the rear end 3b of the plunger 3.

For the urging coil spring 4, a spring having a suitable length, strength, and so forth is selected according to the urging force to be applied to the plunger 3.

A Conductive (Contact-Stabilizing) Coil Spring

The conductive coil spring 5, which is attached towards the opening at the one end 2a of the barrel 2, is inserted between the inner wall 21 of the barrel 2 and the outer circumferential surface of the small-diameter portion 34 of the plunger 3. Since it has a function for stabilizing a state of the electrical contact between the barrel 2 and the plunger 3, it is formed of a conductive material (hereinafter also called "contact-stabilizing coil spring").

In this embodiment, with the contact-stabilizing coil spring 5 received inside the barrel 2, one end of the coil spring 5 is disposed at the open end 2a of the barrel 2, and the contact-stabilizing coil spring 5 has a length such that the other end is disposed at the same position as the end of the central large-diameter portion 32 when the plunger 3 is moved maximum length out of the barrel (see FIG. 1). In the illustrated embodiment, it is formed to have a length about ⅓ (One-Third) of the total length of the small-diameter portion 34 provided at the side of the one end of the plunger 3.

The contact-stabilizing coil spring 5 is not limited to the illustrated embodiment; it is possible to attach it with various lengths and arrangements provided it is not compressed and expanded according to the advancing and retracting movement of the plunger 3.

The probe 1 configured as described above is operated, for example, while attached to an IC socket (not shown) which is used in testing a packaged semiconductor device such as an IC, LSI, etc. By connecting the barrel 2 to a printed wiring pattern formed on the IC socket, it is connected to test equipment (a tester or the like with a built in computer), which is not shown in the drawing, and used in this state.

Thus, when, for example, the semiconductor device serving as the object to be tested is inserted in the IC socket to which the probe 1 according to the present invention is attached, the terminals such as BGA or the like formed on the package of the semiconductor device are pressed against the front end 3a of the plunger 3, and the plunger 3 retreats inside the barrel 2 against the urging force due to the urging coil spring 4. This aspect is the same as in a known probe.

In the probe 1 of the present invention, the contact-stabilizing coil spring 5, which is formed of a conductive material, is disposed in the vicinity of the open end of the barrel 2. This contact-stabilizing coil spring 5 contacts the inner circumference of the barrel at a plurality of locations and also makes contact with the small-diameter portion 34 of the plunger 3 at a plurality of locations. Therefore, contact is established at a plurality of locations between the plunger 3 and the barrel 2 via the contact-stabilizing coil spring 5, whereby increasing the contact area between the probe 3 and the barrel 2.

Figure 4A:
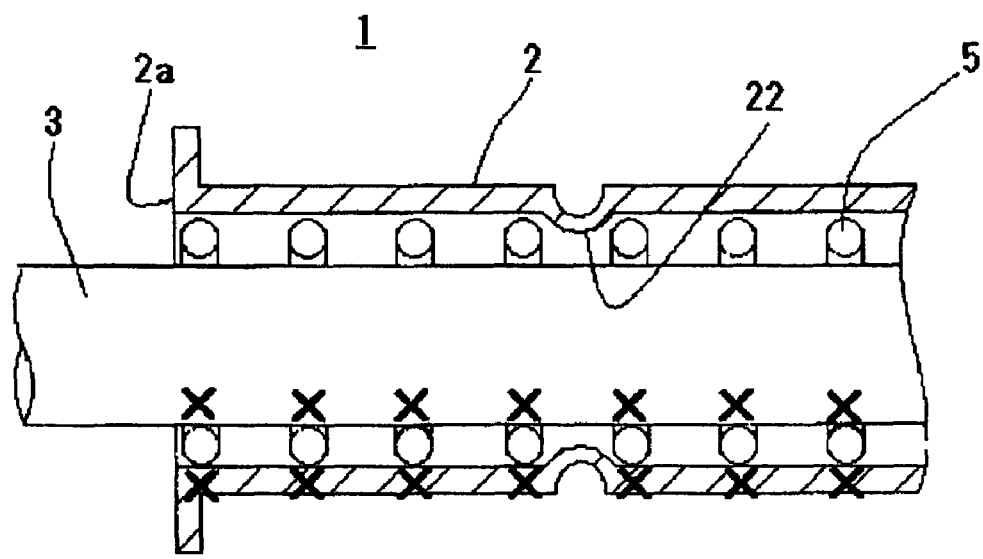
Figure 4B:
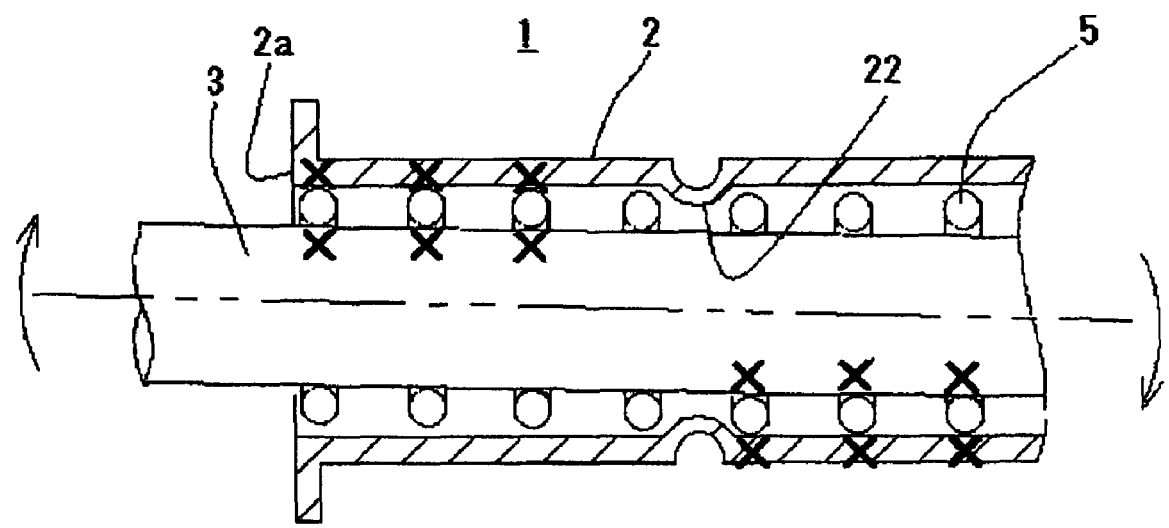
Figure 5:
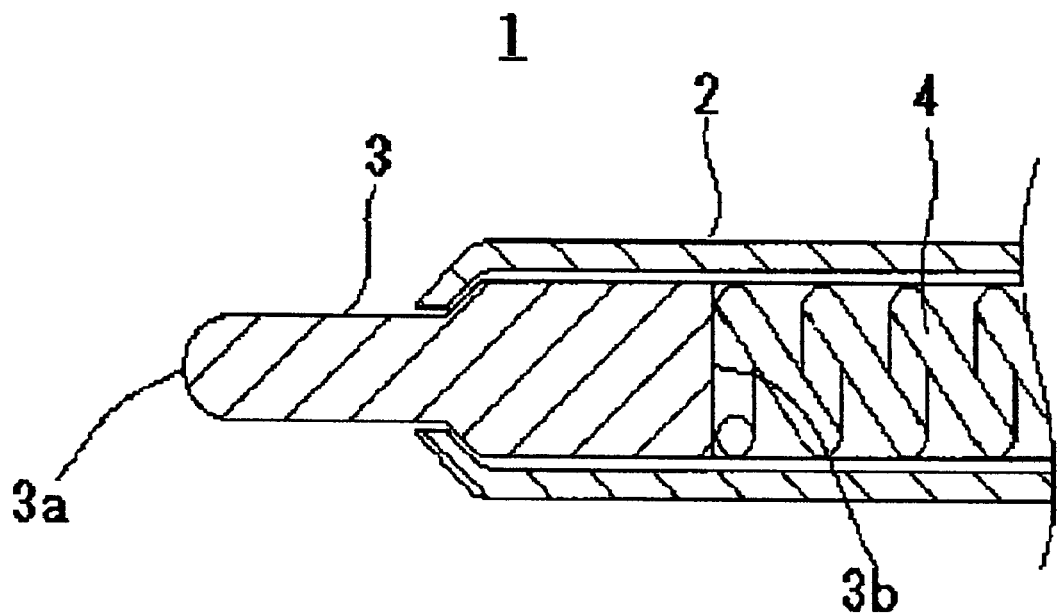
FIG. 5 is a sectional view of the principal part of a probe in the related art.

Furthermore, because deformation of the contact-stabilizing coil spring 5 is possible inside the barrel 2, by swinging the plunger 3 from the contact state where the axial direction of the plunger 3 is parallel to the axial direction of the barrel 2, as shown for example in FIG. 4A, even when the axial direction of the plunger 3 is tilted with respect to the axial direction of the barrel 2, as shown in FIG. 4B, the contact-stabilizing coil spring 5 is slightly deformed according to the swing of the plunger 3; contact is thus established at multiple points between the outer circumference of the plunger 3 and the inner wall of the barrel 2. Therefore, it is possible to perform stable measurement and so forth without substantially changing the electrical contact conditions, even when swinging the plunger 3.

Figure 6:
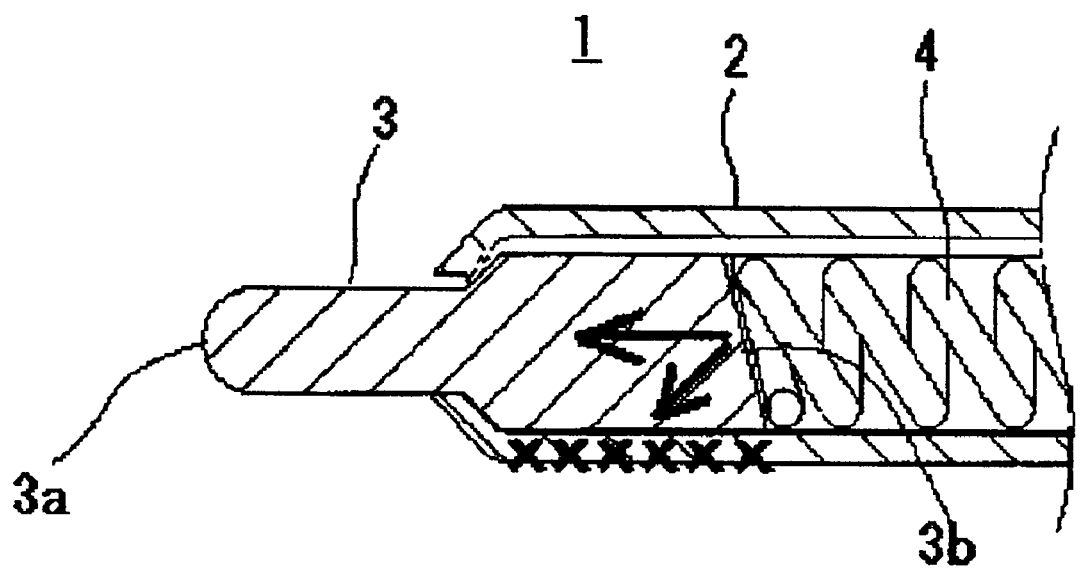
FIG. 6 is a sectional view of the principal part of the probe in the related art (JP2000243500A2)
Figure 7:
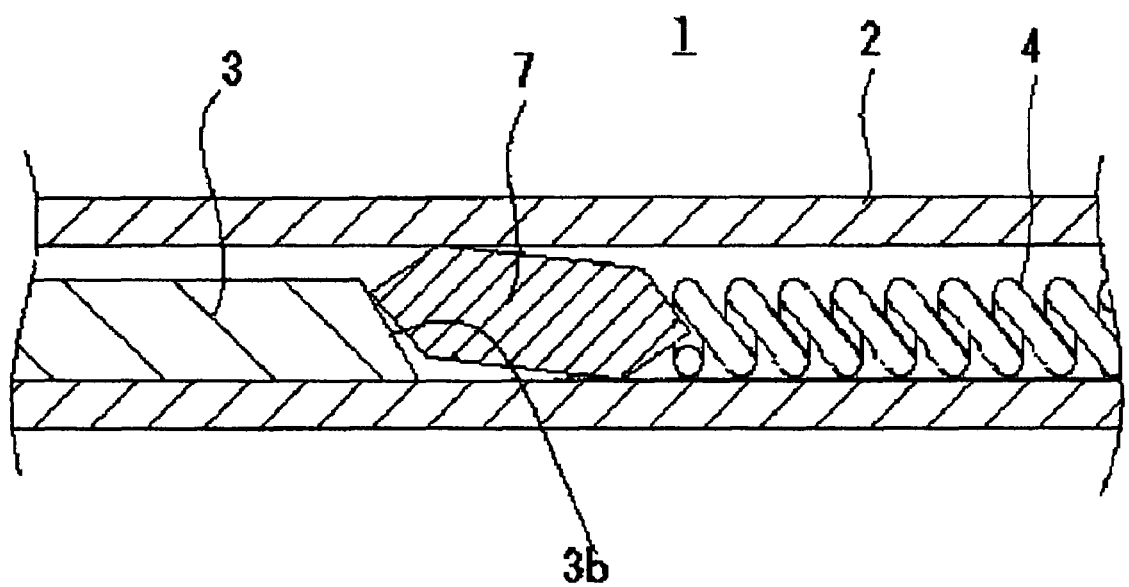
FIG. 7 is a sectional view of the principal part of a probe in the related art (JP200690941A2)
Figure 8A:
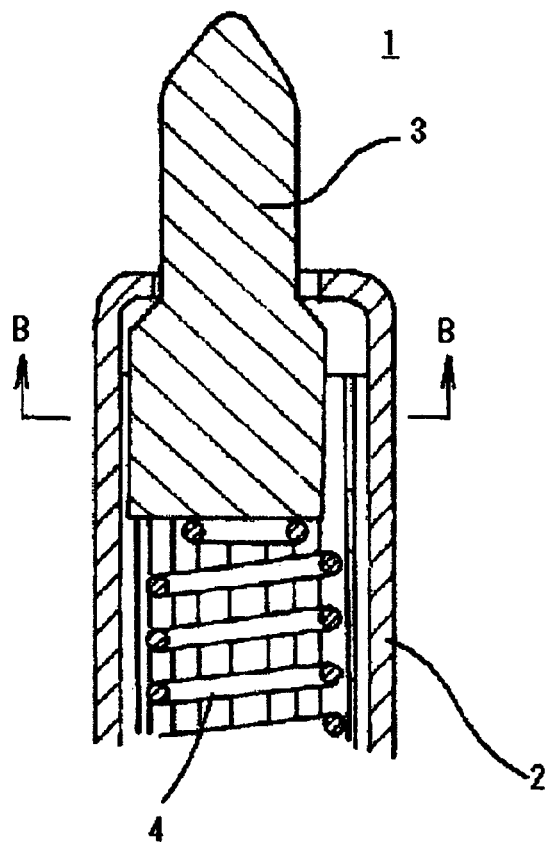
Figure 8B:
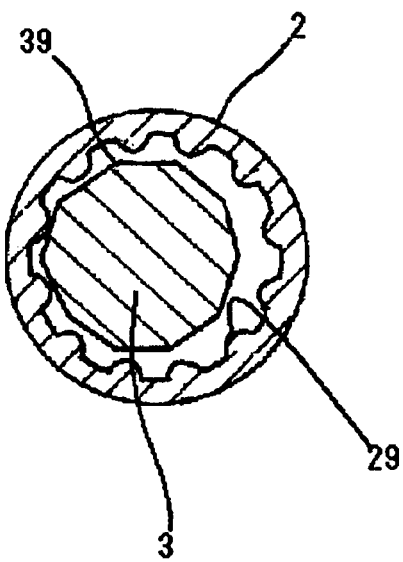
Figure 9:
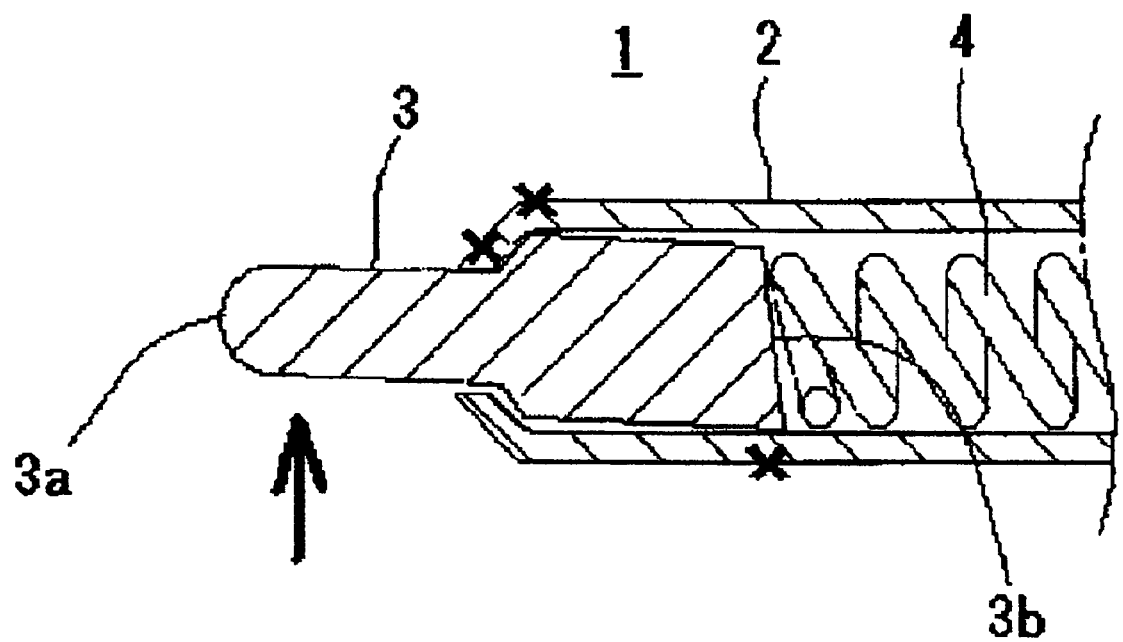
FIG. 9 is a diagram for explaining a state of contact (when the plunger is swung) between the plunger and the barrel in the probe in the related art.

As a result, it is possible to ensure stable electrical contact between the plunger 3 and the barrel 2. In addition, as in the related art described with reference to FIG. 6 and FIG. 9, it is possible to suitably prevent an increase in electrical resistance due to a substantial reduction in the number of contact points between the barrel 2 and the plunger 3, as well as a resulting degradation of the high-frequency characteristics, and so forth.

Thus the broadest claims that follow are not directed to a machine that is configured in a specific way. Instead, the broadest claims are intended to protect the heart or essence of this breakthrough invention. This invention is clearly new and useful. Moreover, it was not obvious to those of ordinary skill in the art at the time it was made, in view of the prior art when considered as a whole.

Moreover, in view of the revolutionary nature of this invention, it is clearly a pioneering invention. As such, the claims that follow are entitled to very broad interpretation so as to protect the heart of this invention, as a matter of law.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A probe, comprising:
   a conductive plunger received inside a cylindrical conductive barrel in which the plunger being capable of moving backward and forward; and
   an urging coil spring for pushing a rear end of the plunger also received inside the barrel so as to urge a front end of the plunger out of an opening at one end of the barrel;
   said plunger including a conductive coil spring said coil spring being compressible and having a first end and a second end;
   said conductive coil spring is inserted between an inner circumference of the barrel and an outer circumference of the plunger; and
   said conductive coil spring is provided for stabilizing electrical contact between said barrel and said plunger without urging said plunger, wherein a first protrusion and a second protrusion are disposed so as to respectively protrude towards the center from the inner wall of said barrel, in such a manner that said first protrusion is provided inside said barrel towards the side of said open end of said barrel for engaging said conductive coil spring between said first end and said second end; and
   said second protrusion is provided in an inner wall in the vicinity of the center in the longitudinal direction of said barrel for engaging a large-diameter portion formed at the side of the rear end of said plunger.

2. A probe according to claim 1, wherein said conductive coil spring is fixed to an inner wall of said barrel.

3. A probe according to claim 1, wherein said conductive coil spring is provided in the vicinity of the opening at the one end of said barrel.

4. A probe according to claim 1, wherein a central and a rear large-diameter portions are provided;
   said central portions is provided substantially at a center in a longitudinal direction of said plunger; and
   said rear large-diameter portion is provided towards the rear end of said plunger; and
   the rest portion of said plunger is a small-diameter portion having a smaller diameter than these large diameter portions.

5. A probe according to claim 1, wherein said plunger is formed in the shape of a cylinder; and said cylinder member having V-shaped channels in the front end of said plunger so as to intersect in cruciform for protruding a plurality of points.

6. A probe according to claim 5, wherein terminals of an object to be tested are a ball grid array (BGA)

7. A probe according to claim 1, wherein a portion towards the side of a closed end of said barrel is bent to form a small curved shape as a whole.

8. A probe according to claim 7, wherein said conductive coil spring is formed to have a length about ⅓ of the total length of a small-diameter portion disposed at a side of one end of said plunger.

9. A probe according to claim 1, wherein, with said conductive coil spring received inside said barrel, one end is disposed at the open end of said barrel, and said conductive coil spring has a length such that the other end is disposed at the same position as the end of said central large-diameter portion when said plunger is moved maximum length out of said barrel.

10. A probe according to claim 1, wherein a projection is formed at the rear end of said plunger, and said projection is inserted inside one end of said urging coil spring.

* * * * *